United States Patent
Hendrikx et al.

(10) Patent No.: US 9,962,923 B2
(45) Date of Patent: May 8, 2018

(54) METHOD FOR PROVIDING LITHOGRAPHIC PRINTING PLATES

(71) Applicant: AGFA GRAPHICS NV, Mortsel (BE)

(72) Inventors: Peter Hendrikx, Mortsel (BE); Paul Callant, Mortsel (BE); Marin Steenackers, Mortsel (BE); Sam Verbrugghe, Mortsel (BE)

(73) Assignee: AGFA NV, Mortsel (BE)

( * ) Notice: Subject to any disclaimer, the term of this patent is extended or adjusted under 35 U.S.C. 154(b) by 0 days. days.

(21) Appl. No.: 14/917,957

(22) PCT Filed: Sep. 29, 2014

(86) PCT No.: PCT/EP2014/070760
§ 371 (c)(1),
(2) Date: Mar. 10, 2016

(87) PCT Pub. No.: WO2015/055409
PCT Pub. Date: Apr. 23, 2015

(65) Prior Publication Data
US 2016/0214370 A1  Jul. 28, 2016

(30) Foreign Application Priority Data
Oct. 15, 2013 (EP) .................................... 13188632

(51) Int. Cl.
*B41C 1/10* (2006.01)
*G03F 7/30* (2006.01)
*G03F 7/105* (2006.01)
*B41M 5/28* (2006.01)
*G03F 7/32* (2006.01)

(52) U.S. Cl.
CPC .......... *B41C 1/1091* (2013.01); *B41C 1/1008* (2013.01); *G03F 7/105* (2013.01); *B41C 1/1025* (2013.01); *B41C 2210/02* (2013.01); *B41C 2210/04* (2013.01); *B41C 2210/06* (2013.01); *B41C 2210/08* (2013.01); *B41C 2210/12* (2013.01); *B41C 2210/22* (2013.01); *B41M 5/28* (2013.01); *G03F 7/322* (2013.01)

(58) Field of Classification Search
CPC .................................................... B41C 1/1091
See application file for complete search history.

(56) References Cited

U.S. PATENT DOCUMENTS

| | | | |
|---|---|---|---|
| 7,402,374 B2 | 7/2008 | Oohashi et al. | |
| 7,425,406 B2 | 9/2008 | Oshima et al. | |
| 7,462,440 B2 | 12/2008 | Yamasaki | |
| 2006/0098235 A1* | 5/2006 | Bourne | B41C 1/147 358/3.29 |
| 2010/0227269 A1* | 9/2010 | Simpson | B41C 1/1008 430/270.1 |
| 2010/0310989 A1 | 12/2010 | Figov et al. | |
| 2010/0316956 A1 | 12/2010 | Memetea et al. | |
| 2011/0097666 A1* | 4/2011 | Savariar-Hauck | B41C 1/1008 430/270.1 |
| 2012/0045720 A1 | 2/2012 | Figov et al. | |

FOREIGN PATENT DOCUMENTS

| | | | |
|---|---|---|---|
| EP | 0 127 477 A2 | 12/1984 | |
| EP | 0 419 095 A2 | 3/1991 | |
| EP | 1 614 541 A2 | 1/2006 | |
| EP | 1 865 382 A1 | 12/2007 | |
| EP | 2 113 381 A2 | 11/2009 | |
| WO | 2006/005688 A1 | 1/2006 | |
| WO | 2009/023112 A1 | 2/2009 | |
| WO | 2010/101632 A1 | 9/2010 | |
| WO | WO 2011103378 A1 * | 8/2011 | B41J 3/407 |

OTHER PUBLICATIONS

Official Communication issued in International Patent Application No. PCT/EP2014/070760, dated Jan. 7, 2015.

* cited by examiner

*Primary Examiner* — Joshua D Zimmerman
(74) *Attorney, Agent, or Firm* — Keating and Bennett, LLP

(57) ABSTRACT

A method of making a lithographic printing plate includes the steps of a) image-wise exposing a lithographic printing plate precursor including a hydrophilic support and a coating containing a colorant precursor to form a lithographic image consisting of printing areas and non-printing areas, b) developing the plate precursor to remove the coating in the non-printing areas from the support, and c) drying the plate precursor, and d) subjecting the plate precursor to heat or radiation to induce a colour change of the coating in the printing areas, wherein before step b) the coating in the non-printing areas and the support are characterised by a CIE 1976 colour difference $\Delta E_1$ which is 5.0 or less, and after step d) the CIE 1976 colour difference $\Delta E_2$ between the coating in the printing areas and the non-printing areas is more than 6.8.

23 Claims, No Drawings

METHOD FOR PROVIDING LITHOGRAPHIC PRINTING PLATES

CROSS-REFERENCE TO RELATED APPLICATIONS

This application is a 371 National Stage Application of PCT/EP2014/070760, filed Sep. 29, 2014. This application claims the benefit of European Application No. 13188632.7, filed Oct. 15, 2013, which is incorporated by reference herein in its entirety.

BACKGROUND OF THE INVENTION

1. Field of the Invention

The invention relates to a method of processing imaged printing plate precursors.

2. Description of the Related Art

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

In order to be able to evaluate the resulting lithographic printing plates for image quality, such as image resolution and detail rendering (usually measured with an optical densitometer) before mounting them on the press, the lithographic printing plate precursors contain a colorant (dye or pigment) in the radiation-sensitive coating. Such colorants provide a contrast between the image and the hydrophilic support (where the coating has been removed). Besides allowing for the evaluation of the image quality, a high contrast between the image and the hydrophilic support is required to obtain a good image registration (alignment) of the different printing plates in multi-colour printing in order to ensure image sharpness (resolution) and a correct rendering of the colours in the images present.

It is a well known phenomenon that offset lithographic printing plate precursors containing a coating with sufficient colouration in order to generate printing plates that have image parts that are visible and measurable after processing, can leave significant contaminants of the colouration dye or pigment within the developer unit, the rinsing unit and the gumming unit. Dye residues turn the processing solutions, being the developer, rinsing solution or gum coloured and cannot be so easily removed. After processing an amount of lithographic printing plate precursors, the accumulation of the colorant in the processing solutions is leading to very dark coloured solutions, which ultimately may lead to premature replacement by the operator, while the activity of the processing solution, is still sufficient. This leads to an increased amount of waste at the customer site. In case the processing of the printing plate precursor is performed in one single step, a single processing solution is used to both develop the imaged printing plate precursor by removing predominantly the coating in the non-printing areas and also to provide a protective layer or gum coating, over the entire plate surface. In this respect, the non-printing areas tend to be coloured due to coloured gum being left on the plate surface. Additionally, contamination by coloured gum of the conveyor street and the belt to the punch bender can be observed. Also the plate stacker gets visually stained. Moreover, processor parts, which are in contact with the dark coloured processing solutions show accumulation of coloured residue after evaporation of the solvent of the processing solution. This all requires a high frequency of cleaning of the processing equipment.

The use of contrast-providing colorants obtained from leuco dyes that become coloured in the presence of a thermal acid generator, is described for example, in U.S. Pat. Nos. 7,402,374, 7,425,406, and 7,462,440. The colouring of the printing areas of negative working printing plate precursors is initiated by the image-wise exposure to obtain a good visibility of the image before performing an on-press development of the plate precursor. Hence the printing plates are all designed for on-press development without undergoing alkaline development in a processing apparatus. This solution however is not compatible with positive working lithographic printing plate precursors, since the exposed parts of the radiation sensitive coating are dissolved in the developer and still would give rise to a colouration of the developer and the rinsing solution. Moreover, the coating in printing areas is not coloured since it is not exposed by the laser and as a result a poor image contrast is obtained.

Thus, there is a need to provide colour image contrast in positive and negative working lithographic printing plates without causing problems related to the colouration of the processing solution due to the processing of the printing plate precursors.

A colour contrast image in imaged lithographic printing precursors can be obtained after processing by contacting the imaged precursor with a colouration solution containing a colourless form of a photochromic compound as disclosed in US 20120045720 A. Residual amounts of this compound attached to the oleophilic surface of the imaged precursor can be changed to its coloured form when exposed to UV light. This solution requires however a processor having an extra tank to contain the colouring solution which increases cost and complexity of the processor.

In US 20100316956 A a method is provided to improve contrast between the image and background of lithographic printing plates by applying a colouring fluid to the imaged and processed precursor. Also in this case, an additional processing solution, which must be coloured, is required during the plate making process.

EP 0419095 A and EP 0127477 A disclose radiation sensitive compositions containing dyes which undergo a colour change on baking after exposure and development. The colour change is to obtain an indication of whether or not the heating has been adequately done. All radiation sensitive compositions however do comprise a colorant which will lead to a strong colouration of the developer.

WO2010/101632A claims an imagable element having thereon a radiation-sensitive imagable layer comprising a pigment and a dye that can change colour when heated. This combination gives at the same time a high visual image contrast of the printing plate for visual inspection and an indication of a postbake step due to a decrease in colour density. The high visual contrast of the imagable layer will lead to strong colouration of the developer.

WO2006/005688A and EP1614541A describe a negative-working heat-sensitive lithographic printing plate precursor which is capable of providing directly after image-wise heating, a visible image. This so-called 'print-out image' is formed before the development of the printing plate precursor and enables the quality control of the printing plate precursor before the development step.

In EP 1865382 A a method for preparation of lithographic printing plates is disclosed which comprises an overall exposure to light after the image exposure and development step of the radiation sensitive element. The coverage of the photosensitive layer by an amount of developer that blocks the oxygen, preventing any inhibition effect on the polymerisation reaction during the overall exposure, leads to a good developing property and an excellent printing durability of the resulting printing plate.

US 2010/0310989 A describes a method of obtaining lithographic printing plates by contacting an infrared radiation-imaged negative-working lithographic printing plate precursor with a processing solution having a pH less than 9 and comprising a UV photoinitiator, followed by a flood-wise exposure with UV radiation to increase the imaging sensitivity and the press life of the resulting plate. The flood-wise exposure with UV radiation of the precursor in the presence of a UV photoinitiator is to be seen as a post-treatment in order to further polymerise the radiation sensitive layer, improving thereby the sensitivity of the precursor and the hardness of the coating in the image areas of the plate. No solution for reducing colouration of the processing solution is provided.

There is a need for an improved means for providing contrast between the image and background of lithographic printing plates, prepared from negative and positive working lithographic printing precursors without causing problems related to the colouration of the processing solutions.

SUMMARY OF THE INVENTION

Therefore, preferred embodiments of the present invention provide a solution for reduced colouration of processing solutions upon processing positive or negative working printing plate precursors and hence preserve a high image contrast between the printing and non-printing areas of the printing plate. This has been achieved by a method of making a lithographic printing plate comprising the steps of: a) image-wise exposing a lithographic printing plate precursor wherein the printing plate precursor comprises a hydrophilic support and a coating comprising a colorant precursor, forming a lithographic image consisting of printing areas and non-printing areas, the non-printing areas and the support are characterised by a CIE 1976 colour difference $\Delta E_1$ which is 5.0 or less; b) developing the plate precursor, thereby removing the coating in the non-printing areas from the support; c) drying the plate precursor and finally d) subjecting the lithographic plate to heat or radiation inducing a colour change of the coating in the printing areas to obtain a CIE 1976 colour difference $\Delta E_2$ between the coating in the printing areas and the non-printing areas of more than 6.8.

Other features, elements, steps, characteristics and advantages of the present invention will become more apparent from the following detailed description of preferred embodiments of the present invention. Specific preferred embodiments of the invention are also defined in the dependent claims.

DETAILED DESCRIPTION OF THE PREFERRED EMBODIMENTS

A. Lithographic Printing Plate Precursors

The present invention relates to a method using lithographic printing plate precursors comprising one or more colorant precursors. Colorant precursors are compounds which can change from essentially colourless or pale-coloured to coloured when exposed to UV light, IR light and/or heated. All publicly-known leuco dyes can be used as colorant precursors and are not restricted. They are for example widely used in conventional pressure-sensitive, photosensitive or thermally-sensitive recording materials. For more information about leuco dyes, see for example "Chemistry and Applications of Leuco Dyes", Ramaiah Muthyala, Plenum Press, 1997.

A number of classes of leuco dyes are preferred for the present invention: spiropyran Leuco Dyes such as spirobenzopyrans (e.g. Spiroindolinobenzopyrans, Spirobenzopyranobenzopyrans, 2,2-Dialkylchromenes) for example CASRN 160451-52-5 and CASRN 393803-36-6, spironaphtooxazine and spirothiopyran; leuco quinone dyes; azines such as oxazines, diazines, thiazines and phenazine such as shown in EP 174054 A (CASRN104434-37); phthalide- and phthalimidine-type leuco dyes such as triarylmethane phtalides (e.g. crystal violet lactone), diarylmethane phthalides, monoarylmethane phthalides, heterocyclic substituted phthalides, alkenyl substituted phthalides, bridged phthalides (e.g. spirofluorene phthalides and spirobenzanthracene phthalides) and bisphthalides; fluoran leuco dyes such as fluoresceins, rhodamines and rhodols; triarylmethanes such as Leuco Crystal Violet; ketazines; barbituric acid leuco dyes and thiobarbituric acid leuco dyes.

An additional class of preferred leuco dyes for the present invention consists of "IR-leuco dyes". The term "IR-leuco dyes" as used herein refers to infrared dyes having no substantial absorption in the visible light wavelength range which can change from essentially colourless or pale-coloured to coloured when irradiated with UV light, IR light and/or heated. A number of IR-leuco dyes which are preferred are disclosed in WO 2009/080689 p. 26-33, WO 2006/136543 p. 5, line 12 to p. 8, line 8, EP 1736312 A

[0014]-[0021], US 20070212643 A [0014]-[0029] and US 20130101938 A [0026]-[0027] and [0030]-[0031].

In a preferred embodiment of the present invention, the leuco dyes can be incorporated into any layer of the coating of the lithographic printing plate precursor, preferably by adding them to the coating solution of the appropriate layer. The concentration of the leuco dye is preferably to be chosen in such a way that the colouration of the developer or the gum is as low as possible. Investigations have shown that the colouration of the processing solutions (developer, gum developer, rinsing solution, gum) is decreased substantially as compared to the state of the art when the amount of colorant precursor, such a the leuco dye in the coating is such that the colour difference ΔE between the coating in the non-printing areas and the support, after image-wise exposure, is equal or less than 5.0. ΔE is the CIE 1976 colour distance Delta E that is defined by the pair wise Euclidean distance of the CIE L*a*b* colour coordinates. CIE L*a*b* colour coordinates are obtained from reflection measurement in 45/0 geometry (non-polarized), using CIE 2° observer and D50 as illuminant. See CIE S 014-4/E: 2007 Colourimetry—Part 4: CIE 1976 L*a*b* Colour Spaces and CIE publications: CIE S 014-1/E:2006, CIE Standard Colourimetric Observers. Hereafter, the colour difference between the coating in the non-printing areas and the support, which is calculated from the L*a*b* values of the coating in the non-printing areas after image-wise exposure and the L*a*b* values of the support, is denoted by $\Delta E_1$. Before the measurement of L*a*b* values of the support can be done, the coating of a lithographic printing plate precursor has to be removed to reveal the surface of the support. The removal of the coating is preferably done by means of solvents such as, tetrahydrofuran, 1-methoxy-2-propanol, butanone, propanone, water, mixtures thereof or developers such as the Violet CF gum NP. The complete removal of the coating from the support can be checked by means of analytical techniques, for example by GC-MS.

The concentration of the leuco dyes with respect to the total dry weight of the coating in which the leuco dye is incorporated, is preferably from 0.1 wt. % to 20.0 wt. %, more preferably from 0.5 wt. % to 15.0 wt. %, most preferred from 1.0 wt % to 10.0 wt %.

The leuco dyes can optionally be combined with a photosensitizing dye and/or a photoacid generator. All publicly-known photoacid generators can be used for the present invention. They can optionally be combined with a photosensitizing dye. Photoacid generators are for example widely used in conventional photoresist material. For more information about these photoacid generators and photosensitizing dyes, see HINSBERG, W. D., et al. Encyclopedia of Polymer Science and Technology: Lithographic resists. Edited by JOHN WILEY., 2012. p. 13-16. or GREEN, W. Arthur. Industrial Photoinitiators, A technical Guide. Edited by CRC PRESS. N W: Taylor, 2010. p. 83, 150-164., Photoacid Generator Selection Guide from BASF. A number of classes of photoacid generators and H-donor precursors are preferred for the present invention, for example: iodonium salts, sulfonium salts, ferrocenium salts, sulfonyl oximes, halomethyl triazines, halomethylarylsulfone, α-haloacetophenones, sulfonate esters, t-butyl esters, allyl substituted phenols or t-butyl carbonates.

The concentration of the photoacid generators with respect to the total dry weight of the coating in which the photoacid generator is incorporated, is preferably from 0.1 wt. % to 20.0 wt. %, more preferably from 0.5 wt. % to 15.0 wt. %, most preferred from 1.0 wt. % to 10 wt. %.

In a more preferred embodiment of the present invention, a combination is used of at least one compound selected from the group consisting of CASRN 50292-95-0, CASRN 89331-94-2, CASRN1552-42-7 (crystal violet lactone), CASRN148716-90-9 or CASRN 132467-74-4 as a leuco dye and at least one compound selected from the group consisting of CASRN 58109-40-3, CASRN 300374-81-6, CASRN 1224635-68-0, CASRN 949-42-8, CASRN 69432-40-2, CASRN 3584-23-4, CASRN 74227-35-3 or CASRN6542-67-2 as a photoacid generator.

A.1. Negative Working Printing Plate Precursors

Negative working lithographic printing plate precursors typically form an image by light- or heat-induced chemical crosslinking or polymerisation of a photopolymer coating or by physical insolubilization due to heat-induced coalescence, fusing or melting of thermoplastic polymer particles. Specially designed negative plates allow processing without hazardous developer, i.e. of high pH or containing a large amount of organic solvents, e.g. by using gums or a fountain solution of neutral or low pH.

Plate Precursors Based on Coalescence of Thermoplastic Polymer Particles

Suitable coating compositions to which the colorant precursor and optionally the photoacid generator can be added to obtain a coating which can be used in the present invention are described in WO 02/21215 p. 6-9, WO 2006/037716 p. 8-10, EP 1614538 A [0017]-[0039].

The substrate, on which the coating composition can be applied to form a radiation sensitive coating which can be used in the present invention, generally has a hydrophilic surface, or at least a surface that is more hydrophilic than the applied radiation-sensitive composition on the imaging side. The substrate comprises a support that can be composed of any material that is conventionally used to prepare lithographic printing plates. It is usually in the form of a sheet, film, or foil (or web), and is strong, stable, and flexible and resistant to dimensional change under conditions of use so that colour records will register a full-colour image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metalized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuric acid anodized aluminum support that provides a hydrophilic surface.

An interlayer may be formed by treatment of the aluminum support with, for example, a silicate, dextrine, calcium zirconium fluoride, hexafluorosilicic acid, poly(vinylphosphonic acid) (PVPA), vinyl phosphonic acid copolymer, poly[(meth)acrylic acid] or an (meth)acrylic acid copolymer to increase hydrophilicity. Still further, the aluminum support may be treated with a phosphate solution that may further contain an inorganic fluoride (PF). The aluminum support can be electrochemically-grained, phosphoric acid-anodized, and treated with poly(acrylic acid) using known procedures to improve surface hydrophilicity.

Plate Precursors Based Chemical Crosslinking or Polymerisation of a Photopolymer Coating Suitable coating compositions of the photopolymerisable layer to which the colorant precursor and optionally the photoacid generator can be added to obtain a coating which can be used in the present invention, are described in US 2012045720 [0053]-[0109], WO 2008/145528 p. 5, 1.11-p. 23, 1.29, WO 2006/048443 p. 6, 1.4-p. 63, 1.8.

Plate precursors based on chemical crosslinking or polymerisation of a photopolymer, usually have a protective overcoat layer. Examples of coating compositions to obtain suitable overcoat layers are disclosed in US 2012045720 [0110]-[0115], WO 2008/145528 p. 23, 1.31-p. 25, 1.3, WO 2006/048443 p. 64, 1.14-p. 68, 1.17.

Additionally, intermediate layers can be incorporated between the support and the radiation sensitive coating to improve e.g. run length. Suitable compositions for these intermediate layers are described in WO 2008/145528 p. 25, 1.5-p. 26, 1.22. The colorant precursor and the optionally photoacid generator can be present in every layer of the negative working printing plate precursor but preferably in the radiation sensitive layer or photopolymerisable layer.

The support to which the radiation sensitive coating or the intermediate coating is applied on, is the same as described above.

A.2. Positive Working Printing Plate Precursors

Positive-working lithographic printing precursors can be single- or multi-layer imagable elements that generally rely on a radiation absorbing compound dispersed within one or more polymeric binders that, upon suitable irradiation, are soluble, dispersible, or removable in processing solutions including alkaline developers. The composition of and methods of making positive working plate precursors in which the leuco dyes and optional photoacid generators are to be incorporated are described in e.g. US 20090197206 [0171]-[0284], US 2012045720 [0120]-[0138], EP 1826001 A [0012]-[0047] and EP 2366545 A [0011]-[0090].

The leuco dyes and photoacid generators can be added to the coating solution of one of the layers or in all layers of the coating of the positive working lithographic printing plate precursor.

The support, to which the radiation sensitive layer or the intermediate layer is applied on, is the same as described above.

B. Image-Wise Exposure

A method of the invention comprises the image-wise exposure of the lithographic printing plate precursor to obtain a lithographic image consisting of printing areas and non-printing areas. The lithographic image obtained by exposure is a latent image wherein the printing areas and non-printing areas are revealed after development by removal of the coating in the non-printing areas. The imaging is done by exposing the plate precursor to radiation such as UV radiation, visible light, near-infrared, or infrared radiation, at a wavelength of from about 150 to about 1500 nm. In some preferred embodiments, imaging is carried out using a source of UV radiation or "violet" imaging or exposing radiation at a wavelength of from at least 150 nm and up to and including 475 nm, typically at a wavelength of from 200 nm and up to and including 450 nm and more typically at a wavelength of from 35 nm and up to and including 450 nm. In another preferred embodiment of the invention, imaging can be carried out using imaging or exposing radiation, from an infrared radiation-emitting laser at a wavelength of at least 700 nm and up to and including about 1400 nm and typically at least 700 nm and up to and including 1200 nm. Imaging can be carried out using imaging radiation at multiple wavelengths at the same time if desired.

Image-wise exposure can also be performed in the same way as with analogue UV sensitive printing plate precursors, using a conventional image mask (film) and a mercury vapour electrical discharge bulb or a digital image mask based on DMD technology (Texas Instruments). Examples of suitable devices are the BasysPrint UV-setter (Xeikon), the Cron CTcP imager, and the Lüscher Xpose UV engine. This imaging is done with energies of at least 30 mJ/cm$^2$ and up to and including 500 mJ/cm$^2$, and typically at least 50 and up to and including 300 mJ/cm$^2$ depending upon the sensitivity of the radiation sensitive layer.

The laser used to expose the radiation sensitive layer is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can be configured as a flatbed recorder or as a drum recorder, with the imagable member mounted to the interior or exterior cylindrical surface of the drum.

Useful UV radiation and "violet" imaging apparatus include the ProSetter (Heidelberger Druckmaschinen), Luxel V-8 (FujiFilm), MakoNews, Mako 2, Mako 4, Mako 8 or the Nautilus (ECRM), Micra (Screen), Polaris and Advantage (Agfa), Avalon V4 (Agfa), LaserJet (Krause), and Andromeda A750M (Lithotech), Alinte 8 (FFEI) imagesetters. Imaging with UV radiation can be carried out generally at imaging energies of at least 1 µJ/cm$^2$ and up to and including 500 µJ/cm$^2$, and typically at least 20 and up to and including 300 µJ/cm$^2$, depending upon the sensitivity of the radiation sensitive coating.

An example of an useful IR-radiation based imaging apparatus, also called thermal imaging apparatus, is the Creo Trendsetter® platesetter available from Kodak which contains laser diodes that emit near infrared radiation at a wavelength of about 830 nm. Other suitable imaging devices include the Crescent 42T Platesetter that operates at a wavelength of 1064 nm (available from Gerber) and the Screen PlateRite 4300 series or 8600 Series platesetters (available from Screen). Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the radiation sensitive layer.

While laser imaging is desired in the practice of this invention, imaging can be performed by any other means that provides thermal energy in an image-wise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040MCSOO1 and a TDK Thermal Head F415 HH7-1089).

C. Preheating

After the image-wise exposing step, the precursor may be pre-heated in a preheating unit, preferably at a temperature of about 80° C. to 150° C. and preferably during a dwell time of about 5 seconds to 1 minute. This preheating unit may comprise a heating element, preferably an IR-lamp, an UV-lamp, heated air or a heated roll. Such a preheat step can be used for printing plate precursors comprising a photopolymerisable composition to enhance or to speed-up the polymerization and/or crosslinking reaction. During the preheating preferably no colour change of the coating in the non-printing areas is occurring, since this would increase the colouration of processing solutions during processing.

In another preferred embodiment of the present invention, the precursor is not preheated after the image-wise exposing step.

D. Processing of the Lithographic Printing Plate Precursor Development Apparatus According to a preferred embodiment of the invention, subsequently to the image-wise exposing step or the preheat step, when a preheat step is present, the plate precursor is processed. The processing comprises the development step. Before developing the imaged precursor, a pre-rinse step might be carried out especially for the negative-working lithographic printing precursors having a protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor.

The development is carried out for a time sufficient to remove predominantly only the coating in the non-printing areas of the image-wise exposed printing plate precursor to reveal the hydrophilic surface of the support, but not long enough to remove significant amounts of the coating in the printing areas. The revealed hydrophilic surface of the support repels inks while the printing areas accept ink.

The imaged elements of the invention can be developed using what is known as "manual" development, "dip" development, or processing with an automatic development apparatus or processor.

The use of automatic development apparatus is well known in the art and generally includes pumping a developer or gum into a developing tank or ejecting it from spray nozzles. The development apparatus can include a rinsing tank for rinsing the printing plate precursor after development and a gum tank for applying a gum capable of protecting the lithographic image on the printing plate against contamination or damage (for example, from oxidation, fingerprints, dust, or scratches). The processing unit may also include a suitable rubbing mechanism (for example a brush or roller) and a suitable number of conveyance rollers. For example, the processing solution can be applied to the imaged element by rubbing, spraying, jetting, dipping, immersing, slot die coating (for example see FIGS. 1 and 2 of U.S. Pat. No. 6,478,483), reverse roll coating (as described in FIG. 4 of U.S. Pat. No. 5,887,214), contacting it with a roller, impregnated pad, or applicator containing the processing solution. For example the imaged printing plate precursor can be brushed with the processing solution, or it can be poured onto or applied by spraying the imaged surface with sufficient force to remove the non-printing areas of the radiation sensitive layer using a spray nozzle system as described for example in [0124] of EP 1,788,431A2 and U.S. Pat. No. 6,992,688.

In a preferable preferred embodiment of the present invention, lithographic printing plate precursors can also be processed with a gum solution, also called a gum developer, only. The development with a gum developer has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. In a preferred embodiment of the present invention, negative-working thermal plates comprising thermoplastic polymer particles or negative-working photopolymer precursors comprising a photopolymerisable composition are processed with a gum solution only. Examples of processing apparatus for singe step processing can be found in WO 2013/034474 p. 31, line 6-27 and EP 1788442 A.

Developer

In one preferred embodiment of the methods according to the present invention, alkaline developers or solvent-based may be used. Solvent based developers have mainly been used to develop negative-working plate precursors, while positive-working plate precursors typically require a highly alkaline developer.

Suitable alkaline developers have been described in US2005/0162505. An alkaline developer is an aqueous solution which has a pH of at least 11, more typically at least 12, preferably from 12 to 14.

Alkaline agents to obtain high pH values can be inorganic or organic alkaline agents. Preferred high pH developers comprise at least one alkali metal silicate, such as lithium silicate, sodium silicate, and/or potassium silicate. Sodium silicate and potassium silicate are preferred, and potassium silicate is most preferred. A mixture of alkali metal silicates may be used if desired. Especially preferred high pH developers comprise an alkali metal silicate having a $SiO_2$ to $M_2O$ weight ratio of at least of at least 0.3, in which M is the alkali metal. Preferably, the ratio is from 0.3 to 1.2. More preferably, it is from 0.6 to 1.1, and most preferably, it is from 0.7 to 1.0.

Other inorganic alkaline agents can be used, e.g. sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate, potassium citrate, tripotassium citrate, and sodium citrate.

Further examples of alkaline agents include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, triisopropanolamine, ethyleneimine, ethylenediamine and pyridine.

A suitable alternative developer for processing positive working lithographic printing plate precursors comprises a non-reducing sugar and a base, as described in EP1403716A. The term "nonproducing sugar" means a saccharide which is free of free aldehyde or ketone group and thus is not reducing, e.g. trehalose type oligosaccharides, glycosides and sugar alcohols obtained by hydrogenating and reducing saccharides. Examples of the trehalose type oligosaccharides include saccharose, and trehalose. Examples of the glycosides include alkyl glycoside, phenol glycoside, and mustard oil glycoside. Examples of the sugar alcohols include D, L-arabitol, ribitol, xylitol, D,L-sorbitol, D,L-mannitol, D,L-iditol, D,L-talitol and dulcitol. Further, maltitol obtained by the hydrogenation of disaccharide or reduced material (reduced starch syrup) obtained by the hydrogenation of oligosaccharide may be used. Preferred among these nonreducing sugars are sugar alcohols and saccharose. Even more desirable among these nonreducing sugars are D-sorbitol, saccharose, and reduced starch syrup because they have buffer action within a proper pH range. The aforementioned nonreducing sugar may be used in combination with an alkaline agent as a base properly selected from the group described above.

Solvent-based alkaline developers typically have a pH below 10.5, especially below 10.2 (measured at 25° C.). Solvent-based developers comprise water and an organic solvent or a mixture of organic solvents. They are typically free of silicates, alkali metal hydroxides, and mixtures of silicates and alkali metal hydroxides. The developer is preferably a single phase. Consequently, the organic solvent or mixture of organic solvents is preferably either miscible with water or sufficiently soluble in the developer that phase separation does not occur. Optional components include anionic, non-ionic and amphoteric surfactants (up to 3% on the total composition weight), and biocides (antimicrobial and/or antifungal agents).

The following solvents and mixtures thereof are suitable for use in solvent-based developers: the reaction products of phenol with ethylene oxide (phenol ethoxylates) and with propylene oxide (phenol propoxylates), such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and propylene glycol with alkyl groups having six or fewer carbon atoms, such as 2-ethoxyethanol, 2-(2-ethoxyethoxy)ethanol, and 2-butoxyethanol. A developer that comprises phenoxyethanol is preferred. The developer typically comprises 0.5 wt % to 15 wt %, preferably 3 wt % to 5 wt %, of the organic solvent or solvents, based on the weight of the developer.

The composition of developers can comprise anionic, non-ionic and amphoteric surfactants (up to 3% on the total composition weight).

Examples of the anionic surfactant include hydroxyalkanesulfonates, alkylsulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene maleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates. Specific examples of suitable anionic surfactants include sodium dodecylphenoxybenzene disulfonate, the sodium salt of alkylated naphthalenesulfonate, alkyl diphenylether sulfonate, disodium methylene-dinaphtalene-disulfonate, sodium dodecyl-benzenesulfonate, sulfonated alkyl-diphenyloxide, ammonium or potassium perfluoroalkylsulfonate and sodium dioctyl-sulfosuccinate.

Suitable examples of the non-ionic surfactants include polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these non-ionic surfactants are polyoxyalkylene adduct of alkylene diamine, polyoxyethylene alkylphenyl ethers and poloxyethylene-polyoxypropylene block polymers. Further, fluorinic and siliconic anionic and non-ionic surfactants may be similarly used.

Examples of the amphoteric surfactant include amino acid-type amphoteric surfactants, imidazolinium salts, imidazolines and betaine-type amphoteric surfactants such as sulfobetaines.

Optional components of developers are biocides (antimicrobial and/or antifungal agents), antifoaming agents or chelating agents (such as alkali gluconates), and thickening agents (water soluble or water dispersible polyhydroxy compounds such as glycerine or polyethylene glycol).

Another alternative silicate-free and sugar-free alkaline aqueous developer composition, as described in US2012/0129033, has a pH of at least 12 and comprises (a) a hydroxide, (b) a metal cation M2' selected from barium, calcium, strontium, and zinc cations, (c) a chelating agent for the metal cation M+ and (d) an alkali metal salt different than all of a, b, and c above.

Gum Developer

Preferred developers to be used according to the invention comprise a gum and are capable of developing and gumming the plate in a single step. Such gum developers have been described in EP1342568A and WO2005/111727. A gum is typically an aqueous liquid which comprises one or more surface protective compounds that are capable of protecting the lithographic image of a printing plate against contamination, oxidation or damaging. Suitable examples of such compounds are film-forming hydrophilic polymers or surfactants. The layer that remains on the plate after treatment with the gum solution and drying preferably comprises between 0.1 and 20 g/m$^2$ of the surface protective compound. This layer typically remains on the plate until the plate is mounted on the press and is removed by the ink and/or fountain when the press run has been started.

Preferred polymers for use as protective compound in the gum solution are gum Arabic, pullulan, cellulose derivatives such as carboxymethylcellulose, carboxyethylcellulose or methylcellulose, (cyclo)dextrin, poly(vinyl alcohol), poly (vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic, cationic, amphoteric and non-ionic surfactants. The gum solution may also comprise one or more of the above hydrophilic polymers as surface protective agent and, in addition, one or more surfactants to improve the surface properties of the coated layer. The surface tension of the gum solution is preferably from 40 to 50 mN/m.

Suitable anionic surfactants to be used as surface protective agents include the anionic surfactants described in the composition of the developer of above. Specific examples include sodium dodecylphenoxybenzene disulfonate, the sodium salt of alkylated naphthalenesulfonate, alkyl diphenylether sulfonate, disodium methylene-dinaphtalene-disulfonate, sodium dodecyl-benzenesulfonate, sulfonated alkyldiphenyloxide, ammonium or potassium perfluoroalkylsulfonate and sodium dioctyl-sulfosuccinate.

Suitable cationic surfactants for use in a gum solution include alkylamine salts, quaternary ammonium salts, polyoxyethylene alkyl amine salts and polyethylene polyamine salts.

Suitable amphoteric surfactants to be used as surface protective agents include the amphoteric surfactants described in the composition of the developer of above. A very suitable example of an amphoteric surfactant, includes Raluphon DCH (i.e. coco alkyl, about 53% C12).

Suitable non-ionic surfactants to be used as surface protective agents include the non-ionic surfactants described in the composition of the developer of above. Specific examples include polyoxyethylene alkylphenyl ethers and poloxyethylene-polyoxypropylene block polymers.

Two or more of the above surfactants may be used in combination in the gum. For example, a combination of two or more different anionic surfactants or a combination of an anionic surfactant and a non-ionic surfactant may be preferred. The amount of such a surfactant is not specifically limited but is preferably from 0.01 to 20 wt. %.

The gum solution and gum developer have preferably a pH from 3.0 to 10.0, more preferably from 4.0 to 9.0. The pH of the gum solution is usually adjusted with a mineral acid, an organic acid an inorganic salt or an alkaline agent in an amount of from 0.01 to 2 wt. %. Examples of the mineral acids include nitric acid, sulfuric acid, phosphoric acid and metaphosphoric acid. Especially organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid. Examples of the inorganic salt include magnesium nitrate, monobasic sodium phosphate, dibasic sodium phosphate, nickel sulfate, sodium hexametaphosphate and sodium tripolyphosphate. Examples of alkaline agents which can be used are described in the section of the developer.

Other inorganic salts can be used as corrosion inhibiting agents, e.g. magnesium sulfate or zinc nitrate. The mineral acid, organic acid or inorganic salt may be used singly or in combination with one or more thereof.

Besides the foregoing components, a wetting agent such as ethylene glycol, propylene glycol, triethylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further optional components include chelate compounds, anti-septic agents, anti-foaming agents and ink receptive agents. Examples of these compounds are disclosed in the unpublished EP 131581738 A [0073-0074].

The viscosity of the gum solution can be adjusted to a value of e.g. between 1.7 and 5 cP, by adding viscosity increasing compounds, such as poly(ethylene oxide), e.g. having a molecular weight between $10^5$ and $10^7$. Such compounds can be present in a concentration of 0.01 to 10 g/l.

A baking gum has a similar composition as described above, with the additional preference towards compounds that do not evaporate at the usual bake temperatures. Specific examples of suitable baking gum solutions are described in e.g. EP-A 222 297, EP-A 1 025 992, DE-A 2 626 473 and U.S. Pat. No. 4,786,581.

E. Drying

According to a method of the present invention, after the processing step, comprising the developing step, the printing plate precursor is dried. In a preferred embodiment the plate is dried by heating the plate in a drying unit which may contain at least one heating element selected from an IR-lamp, an UV-lamp, a heated metal roller or heated air. In a preferred embodiment of the present invention, the plate is dried with heated air as known in the drying unit of a classical developing machine.

F. Treatment of the Lithographic Printing Plate to Induce a Colour Change

According to a method of the invention, after the drying step, the lithographic printing plate is subjected to heat and/or to radiation to induce a colour change of the coating in the printing areas. This is preferably done in a post exposure apparatus. The post exposure apparatus can be situated offline or can be built in the processor apparatus. Since the drying unit comprises heating elements, the colour change can also take place in the drying unit after the plate is dried. The printing plate is considered to be dry when substantially no processing liquid is present on top of the printing areas of the plate precursor.

Visual contrast of the printing areas versus the non-printing areas which are obtained after removal of the coating in the development step, determines the level of likelihood of errors to occur in plate handling by operators, when preparing the lithographic printing plates or setting-up the press. These levels of visual contrast have been assessed within an Agfa internal study by a panel of 9 application specialists in view of skilled, experienced operators [Agfa-internal study, 2003. A non-comprehensive list of examples for errors in plate handling covers e.g.: i) assessment of image quality and artefacts control; ii) reading of a so-called "right exposure tool" (a visual comparison of adjacent areas with e.g. 2×2 and 10×10 pixel structures) as function of exposure dose settings, iii) controlling (completeness of) image content; iv) identifying the right plate per colour channel (CMYK); v) correctly setting ink key presets]. Based on the study, the minimum required visual contrast between the printing areas and the non-printing areas of a lithographic printing plate, corresponds to a ΔE value of 6.8, which represents Grade 2 of the Visual Grey Scale Ruler for change in colour (defined by ISO 105A-02 ISO: 1993 Textiles—Tests for colour fastness—Part A02: Grey scale for assessing change in colour). Hereafter, the colour difference between the coating in the printing areas and the non-printing areas of the printing plate after the treatment inducing a colour change is represented by $\Delta E_2$. A more preferred level of visual contrast between the coating in the printing areas and the non-printing areas of the lithographic printing plate corresponds with a $\Delta E_2$ value higher than 13.6, which represents Grade 1 of the aforementioned Visual Grey Scale Ruler, being equivalent to 2× the contrast of Grade 2 of the Visual Grey Scale Ruler, as this further reduces the chance for erroneous handling. Finally, a level of the perceived visual contrast between the coating in the printing areas and the non-printing areas of the lithographic printing plate, corresponding to a $\Delta E_2$ value higher than 20.4, which is equivalent to 3× the contrast of Grade 2 of the Visual Grey Scale Ruler, is even more preferred, as from this level on, erroneous handling is largely overcome.

Subjecting the printing plate to heat can for example been done with a baking unit which contains at least one heating element selected from an IR-lamp, an UV-lamp, a heated metal roller or heated air. The plate is preferably heated in the baking unit at a temperature above 110° C. and less than the decomposition temperature of the coating, more preferably between 200° C. and 295° C., most preferably between 250° C. and 290° C. A longer heating time is usually used when a lower heating temperature is used, and a shorter heating time is used when a higher heating temperature is used. The plate is preferably heated over a time period of less than 10 minutes, more preferably less than 5 minutes, most preferably less than 2 minutes. Heating can be done by irradiation with lamps emitting infrared light as disclosed in EP-A 1 506 854. In a preferred embodiment of the present invention, the plate, containing in its image recording layer hydrophobic thermoplastic polymer particles as defined in EP-A 1 767 349, is heated by the method as described in EP-A 1 767 349.

In a preferred embodiment of the present invention, the plate is heated by the method as described in EP-A 1 506 854. In another preferred embodiment of the present invention, the plate is heated by the method as described in WO 2005/015318.

Subjecting the printing plate to radiation to induce a colour change can be done by means of a radiation source, such as, a high or low pressure mercury lamp, a cold cathode tube, a black light, an ultraviolet light emitting diode (LED), an ultraviolet laser, and a flash light. Important parameters when selecting a radiation source are the spectrum and the intensity of the UV-radiation. Both parameters may affect the speed of the colour change. Mercury vapour electrical discharge bulbs are suitable UV radiation sources including UV-A and UV-C radiation sources. A typical UV-C radiation source is a low pressure mercury vapour electrical discharge bulb which has a small spectral distribution of energy, with only a strong peak in the short wavelength region of the UV spectrum. A typical UV-A radiation source is a medium or high pressure mercury vapour electrical discharge bulb. By doping the mercury gas in the discharge bulb with iron or gallium, an emission can be obtained that covers both the UV-A and UV-C spectrum. Recently UV-LEDs have become commercially available which also emit in the UV-A spectrum and that have the potential to replace gas discharge bulb UV sources. LEDs are preferred because they allow a more compact design of the curing apparatus.

EXAMPLES

1. Preparation of the Printing Plate Precursors

Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm². Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm², then washed with demineralised water for 11 seconds and post-treated for 3 seconds (by spray) with a solution containing 2.2 g/l PVPA at 70° C., rinsed with demineralised water for 1 seconds and dried at 120° C. for 5 seconds.

The support thus obtained was characterized by a surface roughness Ra of 0.35-0.4 μm (measured with interferometer NT1100) and had an oxide weight of 3.0 g/m².

Preparation of the Printing Plate Precursors PPP-01 to PPP-04

Photopolymerisable Layer

The printing plate precursors PPP-01 to PPP-04 were produced by coating the solutions PL-01 to PL-04 onto the above described support S-01. The components as defined in Table 1 are dissolved in a mixture of 38% by volume of MEK and 62% by volume of Dowanol PM (1-methoxy-2-propanol, commercially available from Dow Chemical. The coating solution was applied at a wet coating thickness of 20 μm and then dried at 120° C. for 1 minute in a hot air circulation oven. The dry coating weight in mg/m² of the active components in the photopolymerisable layer are displayed in Table 1.

TABLE 1

|  | PL-01 | PL-02 | PL-03 | PL-04 |
|---|---|---|---|---|
| Polyacetal I75 | 264.36 | 264.36 | 273.87 | 231.98 |
| Monomer FST 510 | 368.84 | 368.84 | 381.96 | 323.67 |
| Mono Z1620 | 281.77 | 281.77 | 291.90 | 247.26 |
| Hostanox | 0.57 | 0.57 | 0.59 | 0.50 |
| Edaplan LA411 | 1.14 | 1.14 | 1.18 | 1.00 |
| Fluomix | 48.89 | 48.89 | 50.65 | 42.90 |
| HABI | 73.91 | 73.91 | 53.60 | 64.86 |
| MBT | 6.59 | 6.59 | 6.83 | 5.79 |
| Wincon red | 76.97 | 76.97 | — | — |
| Triazin MP | 76.97 | — | — | — |
| Heliogene Blue pigment | — | — | 94.23 | — |
| IR-dye-1 | — | — | — | 10.53 |
| Total dry coating weight (mg/m²) | 1200.00 | 1123.03 | 1177.80 | 928.49 |

1. Polyacetal I75 is a polyacetal binder obtained by modification of PVA with butyraldehyde, 4-carboxybenzaldehyde and octanal and is commercially available as a solid from AZ Electronics.

2. Monomer FST 510 is a reaction product from 1 mole of 2,2,4-trimethyl-hexamethylenediisocyanate and 2 moles of hydroxyethyl-methacrylate. Commercially available from AZ Electronics as a 82 wt % solution in MEK.
3. Mono 21620: a solution in MEK containing 30.1 wt % of a reaction product from 1 mole of hexamethylene-diisocyanate, 1 mole of 2-hydroxyethylmethacrylate and 0.5 mole of 2-(2-hydroxyethyl-piperidine (viscosity 1.7 mm² at 25° C.).
4. Hostanox 03: a phenolic antioxidant, commercially available from Clariant.
5. Edaplan LA411: 10 wt % solution of Edaplan LA 411, a modified siloxane-glycol copolymer commercially available from MUNZING CHEMIE, in Dowanol PM.
6. Fluomix is a violet sensitizer mixture consisting of the following compounds and was prepared as disclosed in WO2008145528:

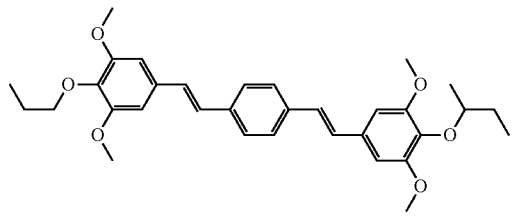

15% by wt.

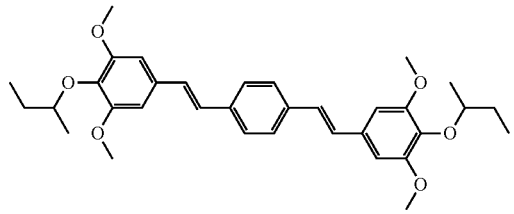

38% by wt.

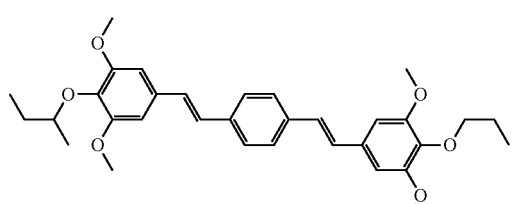

47% by weight

7. HABI: 2-(2-chlorophenyl)-4,5-diphenyl bisimidazole, commercially available from Sumitomo.
8. MBT: 2-mercaptobenzhiazole, commercially available from Lanxess.
9. Wincon Red: 3,3-bis(2-methyl-1octyl-1H-indol-3yl) phthalide. Available from Connect Chemicals.

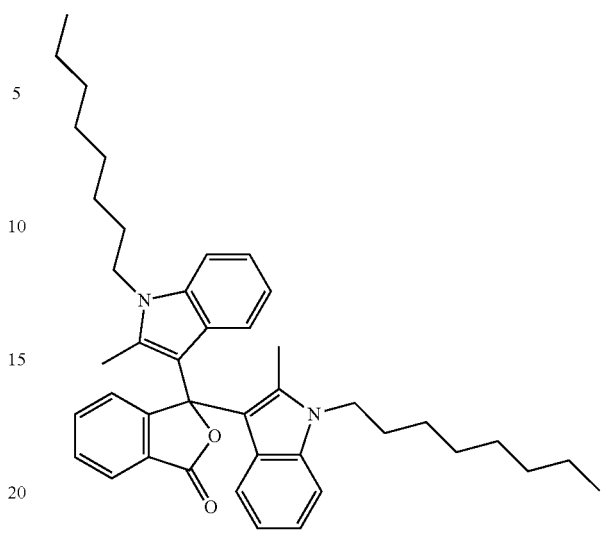

10. Triazine MP: 2-(4-methoxyphenyl)-4,6-Bis(trichloromethyl)-1,3,5-triazine commercially available from Sanwa Chemical.
11. Heliogene Blue: Heliogene Blue D 7490 dispersion (9.9 wt %, viscosity 7.0 mm²/s at 25° C.), commercially available from BASF AG, as defined in Example 7 of EP 1072956 A.

IR-dye-1: a thermochromic IR-dye (IR-leuco dye) with the following chemical structure:

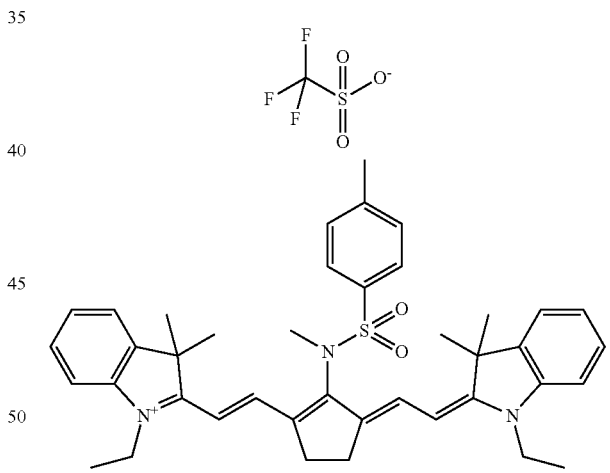

Protective Overcoat Layer

The protective overcoat (OC) layer was applied from an aqueous solution. The wet coating thickness was 40 µm. After drying at 110° C. for 2 minutes a dry coating weight of 1.15 g/m² was obtained. The dry coating weight of each active component (in mg/m²) is given in Table 2.

TABLE 2

| Dry coating weight OC-layer | (mg/m2) |
| --- | --- |
| (1) PVA-1 Mowiol 4 88 | 704.88 |
| (2) PVA-2 Mowiol 4 98 | 424.84 |

TABLE 2-continued

| Dry coating weight OC-layer | (mg/m2) |
|---|---|
| (3) Acticide LA1206 | 2.29 |
| (4) Lutensol A8 | 10.86 |
| Total | 1142.86 |

1. Mowiol 4-88 is a partially hydrolyzed polyvinylalcohol from Kuraray.
2. Mowiol 4-98 is a fully hydrolyzed polyvinylalcohol from Kuraray.
3. Acticide LA1206 is a biocide commercially available from Thor.
4. Lutensol A8 is a surface active agent commercially available from BASF.

Preparation of the Printing Plate Precursor PPP-05

The printing plate precursor PPP-05 was produced by coating onto the above described support S-01 a coating solution containing the components listed in Table 3. These were dissolved in a mixture of 1.6% by weight of MEK, 45.8% by weight of Dowanol PM (1-methoxy-2-propanol) and 22.6% by weight of THF, commercially available from Dow Chemical. The coating solution was applied at a wet coating thickness of 20 μm and then dried at 120° C. for 1 minute in a hot air circulation oven. The obtained dry coating weight in mg/m² of the active ingredients are listed in Table 3.

TABLE 3

| Dry coating weight | (mg/m²) |
|---|---|
| (1) Polyacetal 955 Solution | 496.59 |
| (2) 9900 LB | 218.96 |
| (3) Quadrol | 90.65 |
| (4) SOO94 | 11.00 |
| (5) Polyfox PF652NF | 4.38 |
| (6) Tegoglide 410 | 0.13 |
| (7) Wincon red | 74.45 |
| (8) Triazin MP | 74.45 |
| Total (mg/m²) | 970.61 |

1. Polyacetal 955 Solution is a solution of 20% by weight of polyvinylacetal in 2-butanone, commercially available from AZ Electronics.
2. 9900LB is a solution of 50% by weight of Bakelite PF9900LB in Dowanol PM; Bakelite PF9900LB is a phenolic resin, commercially available from Hexion Specialty Chemicals.
3. Quadrol is a solution of 10% by weight of N,N,N',N'-tetrakis(2-hydroxypropyl)ethylene diamine in Dowanol PM; this compound is commercially available as "Quadrol L" from BASF and has the following chemical structure:

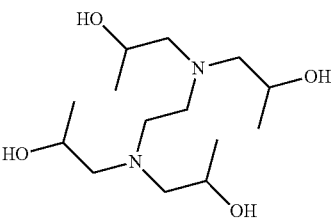 [SMILES: CC(O)CN(CCN(CC(C)O)CC(C)O)CC(C)O]

4. SOO94 is an IR absorbing cyanine dye, commercially available from FEW CHEMICALS; SOO94 has the following chemical structure:

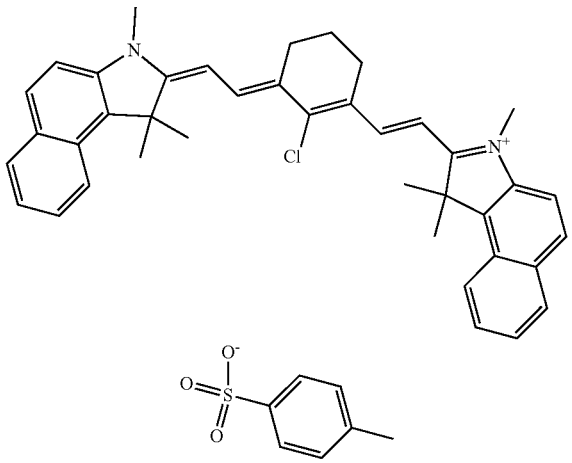

5. Polyfox PF652NF is a solution of 50% by weight of a perfluorosurfactant in Dowanol PM, commercially available from Omnova Solutions; this perfluoro surfactant has the following chemical structure:

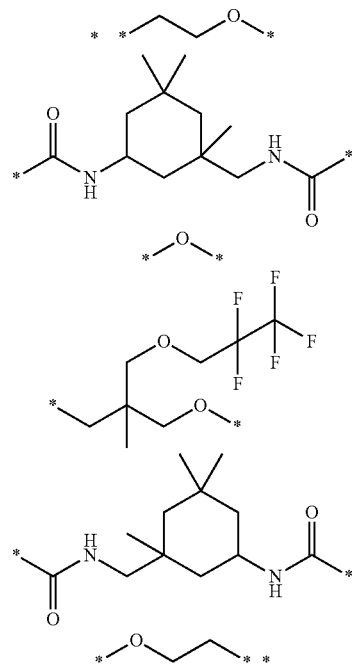

with a number average degree of polymerization x+y equal to approximately 10 and a number average degree of polymerization p+q equal to approximately 17.8;

6. Tegoglide 410 is a solution of 1% by weight of Tego Glide410 in Dowanol PM, commercially available from EVONIK INDUSTRIES.
7. Wincon Red: 3,3-bis(2-methyl-1octyl-1H-indol-3yl) phtalide, available from Connect Chemicals.

2. Image-Wise Exposure of the Printing Plate Precursors

The printing plate precursors PPP-01 to PPP-04 were imaged on a Polaris XCV platesetter (violet laser head), commercially available from Agfa Graphics, at 50 μJ/cm$^2$ through a UGRA Step Wedge, having a wedge constant of 0.15.

The thermal sensitive precursor PPP-04 was also imaged on a thermal platesetter, a Trendsetter 3244 commercially available from Kodak, at 75 mJ/cm$^2$.

The thermal positive printing plate precursor PPP-05 was imaged on a thermal platesetter, a Trendsetter 3244 commercially available from Kodak, at 125 mJ/cm$^2$.

3. Measurement of the $\Delta E_1$ Between the Coating in the Non-Printing Image Areas and the Support $\Delta E_1$ is the colour difference between the coating in the non-printing areas and the support after image-wise exposure and is calculated from the L*a*b* values of the coating in the non-printing areas after image-wise exposure and the L*a*b* values of the support, both being measured with a Gretag Macbeth SpectroEye with the settings: D50 (illuminant), 2° Observer, No filter. The L*a*b* values of the support are measured after removal of the coating. The removal of the coating of the printing plate precursors PPP-01 to PPP-04 is done by wiping with a cotton pad soaked in Violet CF gum NP. The removal of the coating of the printing plate precursor PPP-05 is done by wiping with a cotton pad soaked in butanone. The values of $\Delta E_1$ are listed in Table 4.

4. Development of the Printing Plate Precursors PPP-01 to PPP-05

After image-wise exposure, the negative working printing plate precursors PPP-01 to PPP-04 are processed in a VCF 85 Clean Out Unit of AGFA. An on-line pre-heat treatment was performed in the pre-heat unit of the VCF85 Clean Out Unit at a speed of 1.2 m/min and a temperature, as measured on the backside of the printing plate precursor, of 110° C. This measurement was done by means of sticking a thermostrip, available from KAGER GMBH with a temperature range B between 88° C. to 138° C., to the back side of the plate precursor just before preheating the plate.

After pre-heating, the plates were developed with a "Violet CF gum NP" gumming solution commercially available from Agfa, at a speed of 1.2 m/min and a gum temperature of 24° C. Plates are dried with hot air at 50° C. in the dryer unit of the VCF 85 Clean Out Unit.

After image-wise exposure, the printing plate precursor PPP-05 is developed in an Elantrix 85H processor (Agfa) with TP developer (Agfa) at 28° C. and a dwell time of 16 seconds. After development, the plate precursors are rinsed in the rinsing section with tap water and dried.

5. Overall Exposure of the Printing Plates to IR or UV-Radiation to Induce a Colour Change After drying, the printing plates are subjected to IR-radiation or to UV-radiation according to Table 4. The exposure to IR-radiation is performed on a Creo Trendsetter 3244 equipped with at thermal head type TH1.7, commercially available from Kodak, at an exposure of 1000 mJ/cm$^2$ with a drum speed of 30 rpm. The exposure to UV-radiation is performed on an Agfa Printon CDL1502i Contact frame (Agfa) (no vacuum applied). The plate precursors are put on top of the glass plate and exposed during 1000 units at an exposure level of 3 (corresponding to an exposure density of 200 mJ/cm$^2$). $\Delta E_2$ represents the colour difference between the coating in the printing areas and the non-printing areas, after the overall exposure to UV or IR radiation. $\Delta E_2$ values were calculated from the L*a*b* values of the coating of printing areas and non-printing areas after overall exposure, respectively, based on measurements with a Gretag Macbeth SpectroEye reflection spectrophotometer with the settings: D50 (illuminant), 2° (Observer), No filter. The values of $\Delta E_2$ are listed in Table 4.

TABLE 4

| PPP | Platesetter for the image-wise exposure | Overall exposure | $\Delta E_1$ | $\Delta E_2$ |
| --- | --- | --- | --- | --- |
| PPP-01(INV) | Polaris XCV | UV-radiation | 3.66 | 36.02 |
| PPP-02 (COMP) | Polaris XCV | UV-radiation | 3.26 | 2.89 |
| PPP-03 (COMP) | Polaris XCV | UV-radiation | 33.68 | 32.90 |
| PPP-04 (INV) | Polaris XCV | IR-radiation | 4.07 | 11.94 |
| PPP-04 (INV) | Trendsetter 3244 | IR-radiation | 4.62 | 8.37 |
| PPP-05 (INV) | Trendsetter 3244 | UV-radiation | 4.29 | 27.25 |

The examples according to the invention all show a high visual contrast between the coating in the printing areas and the non-printing areas of the printing plates after development, drying and overall exposure to UV or IR radiation.

6. Colouration of the Developer

The colouration of the developer due to the processing of lithographic printing plate precursors is evaluated with the N94VCFplate (Agfa) and printing plate precursor PPP-01. Therefore, 1.35 m$^2$ of printing plate precursor is soaked in 90 ml of the gum developer Violet CF Gum NP (Agfa Graphics) and stripped off with a rubber blade to collect all of the coating components into the gum developer. The result is a 15 m$^2$/l loaded gum developer. The gum developer is put in a quartz cuvette (light path length of 100 μm) and the transmission at 610 nm is measured with a spectrophotometer Perkin Elmer Lambda 950 in transmission. The values are extrapolated to a light path which is 16 times higher than the measured one to simulate the colouration on processor parts and plates after evaporation of the solvent of the developer. The results are summarized in Table 5.

TABLE 5

| Printing plate precursor | | Transmission at 610 nm |
| --- | --- | --- |
| N94VCF | COMP | 8.25E−9 |
| PPP-01 | INV | 9.51E−4 |

Processing of the plate precursors according to invention (printing plate precursor PPP-01) in the Violet CF Gum NP gum developer leads to a much lower colouration of the developer than processing with the reference plate precursor.

The invention claimed is:

1. A method of making a lithographic printing plate comprising the steps of:
   a) image-wise exposing a plate precursor including a hydrophilic support and a coating containing a colorant precursor to form a lithographic image consisting of printing areas and non-printing areas; and
   b) developing the plate precursor to remove the coating in the non-printing areas from the support; and
   c) drying the plate precursor; and
   d) subjecting the plate precursor to heat or radiation to induce a color change in the coating in the printing areas; wherein
   before step b), the coating in the non-printing areas and the support have a CIE 1976 color difference $\Delta E_1$ which is 5.0 or less; and
   after step d), the CIE 1976 color difference $\Delta E_2$ between the coating in the printing areas and the support revealed by the step of developing is more than 6.8.

2. The method of making a lithographic printing plate according to claim 1, wherein after step d), $\Delta E_2$ between the coating in the printing areas and the support in the non-printing areas is more than 13.6.

3. The method of making a lithographic printing plate according to claim 1, wherein after step d), $\Delta E_2$ between the coating in the printing areas and the support in the non-printing areas is more than 20.4.

4. The method of making a lithographic printing plate according to claim 1, wherein the step of developing the plate precursor is performed with a solution having a pH from 3.0 to 10.0 and including a surfactant.

5. The method of making a lithographic printing plate according to claim 4, wherein the solution has a pH from 4.0 to 9.0.

6. The method of making a lithographic printing plate according to claim 4, wherein the solution is a gum developer.

7. The method of making a lithographic printing plate according to claim 1, wherein the radiation is UV radiation.

8. The method of making a lithographic printing plate according to claim 4, wherein the radiation is UV radiation.

9. The method of making a lithographic printing plate according to claim 5, wherein the radiation is UV radiation.

10. The method of making a lithographic printing plate according to claim 7, wherein the UV radiation is emitted by one or more LEDs.

11. The method of making a lithographic printing plate according to claim 8, wherein the UV radiation is emitted by one or more LEDs.

12. The method of making a lithographic printing plate according to claim 1, wherein the radiation is IR radiation.

13. The method of making a lithographic printing plate according to claim 4, wherein the radiation is IR radiation.

14. The method of making a lithographic printing plate according to claim 5, wherein the radiation is IR radiation.

15. The method of making a lithographic printing plate according to claim 1, wherein the plate precursor includes a sensitizing dye having an absorption maximum in a wavelength range from 350nm to 450nm.

16. The method of making a lithographic printing plate according to claim 4, wherein the plate precursor includes a sensitizing dye having an absorption maximum in a wavelength range from 350nm to 450nm.

17. The method of making a lithographic printing plate according to claim 1, wherein the plate precursor includes a sensitizing dye having an absorption maximum in a wavelength range from 700nm to 1200nm.

18. The method of making a lithographic printing plate according to claim 4, wherein the plate precursor includes a sensitizing dye having an absorption maximum in a wavelength range from 700nm to 1200nm.

19. The method of making a lithographic printing plate according to claim 1, wherein the plate precursor is negative working.

20. The method of making a lithographic printing plate according to claim 4, wherein the plate precursor is negative working.

21. The method of making a lithographic printing plate according to claim 19, wherein the coating includes a sensitizing dye, a radical polymerization initiator, a radically polymerizable compound, and a binder polymer.

22. The method of making a lithographic printing plate according to claim 1, wherein the plate precursor is positive working.

23. The method of making a lithographic printing plate according to claim 4, wherein the plate precursor is positive working.

* * * * *